US012733172B2

(12) United States Patent
Lee et al.

(10) Patent No.: US 12,733,172 B2

(45) Date of Patent: Sep. 8, 2026

(54) VERTICAL NONVOLATILE MEMORY DEVICE HAVING HYDROGEN DIFFUSION BARRIER LAYER AND MANUFACTURING METHOD THEREOF

(71) Applicant: Samsung Electronics Co., Ltd., Suwon-si (KR)

(72) Inventors: Sohyeon Lee, Suwon-si (KR); Seongpil Chang, Suwon-si (KR); Sea Hoon Lee, Suwon-si (KR); Jaeduk Lee, Seongnam-si (KR); Tackhwi Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 400 days.

(21) Appl. No.: 18/446,911

(22) Filed: Aug. 9, 2023

(65) Prior Publication Data

US 2024/0130133 A1 Apr. 18, 2024

(30) Foreign Application Priority Data

Oct. 13, 2022 (KR) ........................ 10-2022-0131564

(51) Int. Cl.

| | |
|---|---|
| ***H10B 43/40*** | (2023.01) |
| ***H10B 41/27*** | (2023.01) |
| ***H10B 41/40*** | (2023.01) |
| ***H10B 43/27*** | (2023.01) |
| ***H10W 20/41*** | (2026.01) |

(52) U.S. Cl.

CPC ............. *H10B 43/40* (2023.02); *H10B 41/27* (2023.02); *H10B 41/40* (2023.02); *H10B 43/27* (2023.02); *H10W 20/435* (2026.01)

(58) Field of Classification Search

None

See application file for complete search history.

(56) References Cited

U.S. PATENT DOCUMENTS

| | | | |
|---|---|---|---|
| 10,283,493 | B1 | 5/2019 | Nishida |
| 10,290,645 | B2 | 5/2019 | Nakatsuji et al. |
| 10,741,575 | B2 | 8/2020 | Jung et al. |
| 10,797,072 | B2 | 10/2020 | Inatsuka et al. |
| 11,276,709 | B2 | 3/2022 | Jung et al. |
| 2019/0148399 | A1 | 5/2019 | Jung et al. |
| 2021/0005628 | A1 | 1/2021 | Jung et al. |
| 2021/0036010 | A1 | 2/2021 | Sim et al. |
| 2021/0066325 | A1 | 3/2021 | Inden |
| 2021/0082943 | A1 | 3/2021 | Jang |

(Continued)

FOREIGN PATENT DOCUMENTS

| | | | |
|---|---|---|---|
| CN | 110993607 | A | 4/2020 |
| KR | 2019/0054470 | A | 5/2019 |

*Primary Examiner* — Sarah K Salerno

(74) *Attorney, Agent, or Firm* — Harness, Dickey & Pierce, P.L.C.

(57) ABSTRACT

A vertical nonvolatile memory device may include a peripheral circuit portion including a memory cell driving circuit and connection wiring; a first hydrogen diffusion barrier layer above the peripheral circuit portion; a first insulating layer above the first hydrogen diffusion barrier layer; a common source line layer above the first insulating layer; a second hydrogen diffusion barrier layer above the first insulating layer; and a memory cell stack structure above the common source line layer and the second hydrogen diffusion barrier layer.

20 Claims, 21 Drawing Sheets

(56) References Cited

U.S. PATENT DOCUMENTS

| | | | | |
|---|---|---|---|---|
| 2022/0084909 | A1 | 3/2022 | Kinoshita | |
| 2022/0085052 | A1 | 3/2022 | Watarai et al. | |
| 2022/0093629 | A1* | 3/2022 | Kim | H10B 43/35 |
| 2022/0199642 | A1 | 6/2022 | Jung et al. | |
| 2023/0328985 | A1* | 10/2023 | Kang | H01L 27/11582 |
| 2023/0389322 | A1* | 11/2023 | Lee | H10B 41/27 |

* cited by examiner

VERTICAL NONVOLATILE MEMORY DEVICE HAVING HYDROGEN DIFFUSION BARRIER LAYER AND MANUFACTURING METHOD THEREOF

CROSS-REFERENCE TO RELATED APPLICATION

This application claims priority to and the benefit of Korean Patent Application No. 10-2022-0131564 filed in the Korean Intellectual Property Office on Oct. 13, 2022, the entire contents of which are incorporated herein by reference.

BACKGROUND

1. Field

The present disclosure relates to a vertical nonvolatile memory device and a manufacturing method thereof, and more particularly, to a vertical nonvolatile memory device having a hydrogen diffusion barrier layer (a hydrogen blocking layer) and a manufacturing method thereof.

2. Description of the Related Art

A semiconductor memory device mainly used as a storage device may include a volatile memory such as a DRAM, an SRAM, or the like, and a nonvolatile memory such as an EEPROM, a FRAM, a PRAM, an MRAM, a flash memory, or the like. Recently, devices using the nonvolatile memory are increasing. For example, an MP3 player, a digital camera, a mobile phone, a camcorder, a flash card, a solid state disk (SSD), and the like may use the nonvolatile memory as a storage device.

Among the nonvolatile memory, the flash memory has a function of electrically erasing data in a cell at a time, and thus, is widely used as a storage device instead of a hard disk. As a storage capacity required by a user increases, a method for efficiently using an area of the flash memory may be required. Accordingly, a nonvolatile memory device having a vertical transistor structure instead of a planar transistor structure has been proposed.

Among the nonvolatile memory device having the vertical transistor structure, a nonvolatile memory device having a cell on peri (COP) structure in which a peripheral circuit portion for controlling an operation such as programming, reading, erasing, or the like of memory cells are disposed vertically below the memory cells used as data storage positions may further improve a degree of integration of a memory cell.

SUMMARY

An embodiment is provided to improve a reliability of a nonvolatile memory device having a vertical transistor structure by limiting and/or suppressing hydrogen permeation into a peripheral circuit portion in a nonvolatile memory device having a cell on peri structure (or a cell-on-periphery structure).

An embodiment is provided to lower a hydrogen content of a gate oxide film in the nonvolatile memory device having the cell-on-periphery structure so that an interface trap density (Nit) is lowered and a time dependent dielectric breakdown (TDDB) is increased to improve a reliability of the nonvolatile memory device.

A vertical nonvolatile memory device according to an embodiment may include a peripheral circuit portion including a memory cell driving circuit and connection wiring; a first hydrogen diffusion barrier layer above the peripheral circuit portion; a first insulating layer above the first hydrogen diffusion barrier layer; a common source line layer above the first insulating layer; a second hydrogen diffusion barrier layer above the first insulating layer; and a memory cell stack structure above the common source line layer and the second hydrogen diffusion barrier layer.

In some embodiments, the second hydrogen diffusion barrier layer may cover sidewalls of the common source line layer and an exposed portion of the first insulating layer, and the exposed portion of the first insulating layer may not be covered by the common source line layer such that the exposed portion of the first insulating layer may be exposed by the common source line layer.

In some embodiments, the vertical nonvolatile memory device may further include a hydrogen diffusion barrier filling layer on the second hydrogen diffusion barrier layer, and the hydrogen diffusion barrier may fill a space between the sidewalls of the common source line layer.

In some embodiments, a material of the second hydrogen diffusion barrier layer may be the same as a material of the hydrogen diffusion barrier filling layer. The second hydrogen diffusion barrier layer and the hydrogen diffusion barrier filling layer may include silicon nitride.

In some embodiments, the hydrogen diffusion barrier filling layer may include at least one of $Al_2O_3$, $Cr_2O_3$, $Er_2O_3$, and $SiN_x$, and the second hydrogen diffusion barrier layer may include silicon nitride.

In some embodiments, the second hydrogen diffusion barrier layer may be between the first insulating layer and the common source line layer.

In some embodiments, the vertical nonvolatile memory device may further include a hydrogen diffusion barrier filling layer filling a space between sidewalls of the common source line layer.

In some embodiments, a material of the second hydrogen diffusion barrier layer may be the same as a material of the hydrogen diffusion barrier filling layer. The second hydrogen diffusion barrier layer and the hydrogen diffusion barrier filling layer may include silicon nitride.

In some embodiments, the hydrogen diffusion barrier filling layer may include at least one of $Al_2O_3$, $Cr_2O_3$, $Er_2O_3$, and $SiN_x$, and the second hydrogen diffusion barrier layer may include silicon nitride.

A manufacturing method of a vertical nonvolatile memory device according to an embodiment may include forming a first hydrogen diffusion barrier layer and a first insulating layer above a peripheral circuit portion, the peripheral circuit portion including a memory cell driving circuit and a connection wiring; forming a preliminary common source line layer above the first insulating layer; patterning the preliminary common source line layer to form a patterned preliminary common source line layer, the patterned preliminary common source line layer exposing sidewalls of the patterned preliminary common source line layer and the first insulating layer between the sidewalls of the patterned preliminary common source line layer; forming a preliminary second hydrogen diffusion barrier layer above the patterned preliminary common source line layer; forming a preliminary filling insulating layer filling a space between the sidewalls of the patterned preliminary common source line layer and above the preliminary second hydrogen diffusion barrier layer; performing a planarization process on a structure including the preliminary filling insulating layer and the preliminary second hydrogen diffusion barrier layer to provide a planarized structure including planarized portions of the preliminary filling insulating layer and the preliminary second hydrogen diffusion barrier layer; and forming a memory cell stack structure above a planarized structure.

In some embodiments, the preliminary filling insulating layer may include silicon oxide, and the preliminary second hydrogen diffusion barrier layer may include silicon nitride.

In some embodiments, the preliminary filling insulating layer may include at least one of $Al_2O_3$, $Cr_2O_3$, $Er_2O_3$, and $SiN_x$, and the preliminary second hydrogen diffusion barrier layer may include silicon nitride.

In some embodiments, the preliminary second hydrogen diffusion barrier layer may be formed of a same material as that of the preliminary filling insulating layer, and the forming the preliminary second hydrogen diffusion barrier layer and the forming the preliminary filling insulating layer may be performed at a same time.

In some embodiments, the preliminary second hydrogen diffusion barrier layer may include silicon nitride and the preliminary filling insulating layer may include silicon nitride.

A manufacturing method of a vertical nonvolatile memory device according to an embodiment may include sequentially forming a preliminary first hydrogen diffusion barrier layer, a preliminary first insulating layer, and a preliminary second hydrogen diffusion barrier layer above a peripheral circuit portion including a memory cell driving circuit and a connection wiring; forming a first hydrogen diffusion barrier layer, a first insulating layer, and a second hydrogen diffusion barrier layer having a via hole or a contact hole by photo-etching the preliminary first hydrogen diffusion barrier layer, the preliminary first insulating layer, and the preliminary second hydrogen diffusion barrier layer; forming a preliminary common source line layer above the second hydrogen diffusion barrier layer; forming a patterned preliminary common source line layer by patterning the preliminary common source line layer to expose sidewalls of the preliminary common source line layer and the second hydrogen diffusion barrier layer between the sidewalls; forming a preliminary filling insulating layer above the patterned preliminary common source line layer, the preliminary filling insulating layer filling a space between sidewalls of the patterned preliminary common source line layer; and performing a planarization process on the preliminary filling insulating layer.

In some embodiments, the preliminary filling insulating layer may include silicon oxide, and the second hydrogen diffusion barrier layer may include silicon nitride.

In some embodiments, the preliminary filling insulating layer may include at least one of $Al_2O_3$, $Cr_2O_3$, $Er_2O_3$, and $SiN_x$, and the second hydrogen diffusion barrier layer may include silicon nitride.

In some embodiments, the second hydrogen diffusion barrier layer may be formed of the same material as the preliminary filling insulating layer.

The vertical nonvolatile memory device having the hydrogen diffusion barrier layer according to an embodiment may have a double hydrogen diffusion barrier layer so that the embodiment limits and/or suppresses hydrogen penetration in the peripheral circuit portion and the like to improve the reliability of the nonvolatile memory device having the vertical transistor structure.

In addition, the vertical nonvolatile memory device having the hydrogen diffusion barrier layer according to an embodiment may cover a side surface of the common source line layer so that the embodiment limits and/or suppresses hydrogen penetration in the peripheral circuit portion and the like to further improve the reliability of the nonvolatile memory device having the vertical transistor structure.

DETAILED DESCRIPTION

Figure 1:
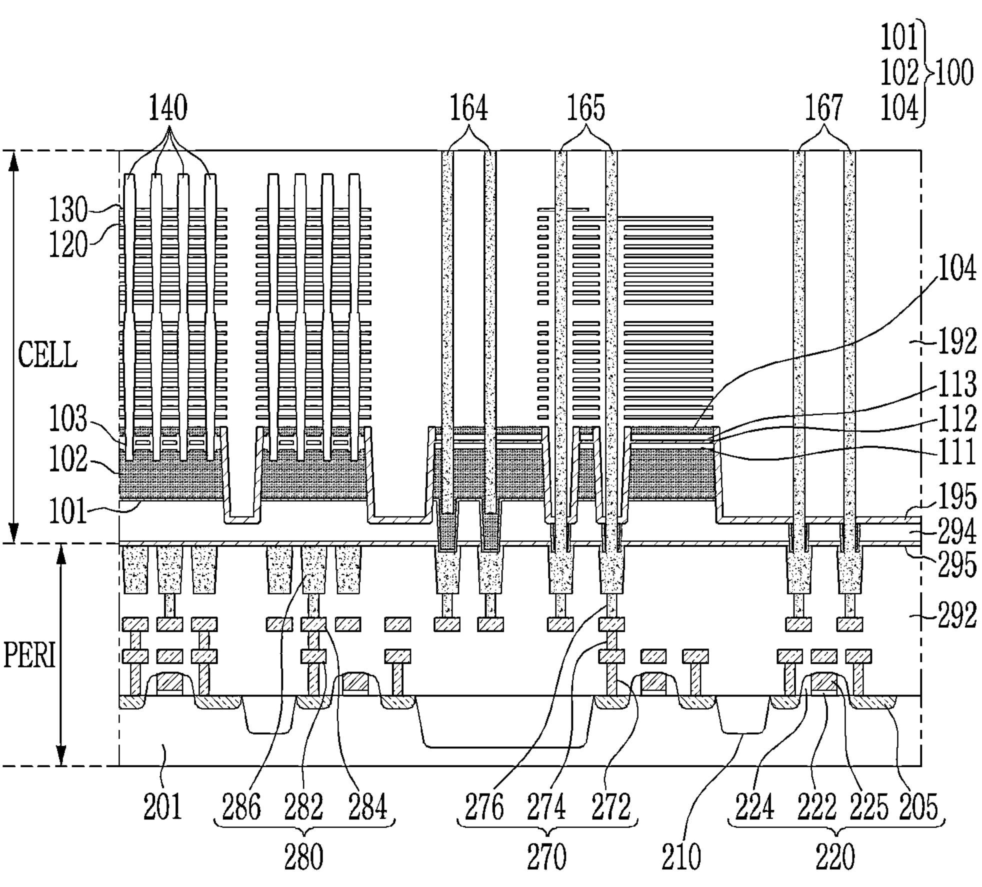
FIG. 1 is a cross-sectional view of a vertical nonvolatile memory device having a hydrogen diffusion barrier layer according to an embodiment.

Embodiments will be described more fully hereinafter with reference to the accompanying drawings. As those skilled in the art would realize, the described embodiments may be modified in various different ways, all without departing from the spirit or scope of the present disclosure.

The drawings and descriptions are to be regarded as illustrative in nature and not restrictive. Throughout the specification, the same reference numerals refer to the same constituent elements.

Further, the size and thickness of each configuration shown in the drawings are optionally illustrated for better understanding and ease of description, the present disclosure is not limited to shown drawings. In the drawings, the thickness of the layer, the film, the plate, the region, etc. may be exaggerated for clarity. In the drawings, the thickness of some layers and regions may be exaggerated for better understanding and ease of description.

As used herein, the singular forms "a" and "an" are intended to include the plural forms as well, unless the context clearly indicates otherwise.

In the specification and claims, the term "and/or" is intended to include any combination of the terms "and" and "or" for its meaning and interpretation. For example, "A and/or B" may be understood to mean "A, B, or A and B".

The phrase "at least one of -" in the specification and claims range is intended to include the meaning of "at least one selected from the group of -" for its meaning and interpretation. For example, "at least one of A and B" may be understood to mean "A, B, or A and B".

It will be understood that although the terms "first" and "second" are used to describe various elements, these elements should not be limited by these terms. These terms are only used to distinguish one element of information from another. For example, without departing from the scope of the present disclosure, first constituent elements may be termed as second constituent elements; and similarly, second constituent elements may also be termed as first constituent elements.

When an element, such as a layer, a film, a region or a substrate, is referred to as being "on" another element, it may be directly on the other element, or an intermediate element may also be present. In contrast, when an element is referred to as being "directly on" another element, there is no intermediate element. In addition, throughout the specification, the term 'above' of the target element should be understood as positioning above or below the target element, and does not necessarily mean positioning 'above' with reference to the opposite direction of gravity.

For example, spatially relative terms "below" and "above" may be used to easily describe the relationship between one element or constituent element and other constituent element as shown in the drawing. Spatially relative terms are intended to include other directions in the device being used or operated in addition to the directions shown in the drawing. For example, when the device shown in the drawing is turned over, a device positioned 'below' another device may be positioned 'above' another device. Accordingly, the term "below" may include both lower and upper positions. A device may also be oriented in different directions, so spatially relative terms may be interpreted differently depending on the direction.

When an element (or a region, a layer, a part, etc.) is referred to as "connected" or "coupled" to another element in the specification, it is directly disposed, connected, or coupled to the other element mentioned above, or an element intervening therebetween may be disposed.

The terms "connected to" or "coupled to" may include a physical or electrical connection or coupling.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a cross-sectional view of a vertical nonvolatile memory device having a hydrogen diffusion barrier layer according to an embodiment.

The vertical nonvolatile memory device having the hydrogen diffusion barrier layer according to the embodiment may include a memory cell portion CELL and a peripheral circuit portion PERI. The memory cell portion CELL may be a part in which memory cells used for data storage are arranged in three dimensions, and the peripheral circuit portion PERI may be a part in which a driving circuit that drives the memory cells to perform an operation such as programming, reading, erasing, or the like is formed. The memory cell portion CELL may be disposed vertically above the peripheral circuit portion PERI.

The peripheral circuit portion PERI may include various semiconductor devices, and the semiconductor device may include a transistor 220 such as a field effect transistor (FET) or the like. The transistor 220 may be arranged to constitute a complementary metal-oxide semiconductor (CMOS). The transistor 220 may be formed in a region separated by a shallow trench isolation (or a shallow trench isolation region) 210 formed at a semiconductor substrate 201, and may include a source/drain region 205, a gate insulating layer 222, a gate electrode 225, a gate spacer 224, and the like. The semiconductor substrate 201 may include a semiconductor material (for example, a group IV semiconductor, a group III-V compound semiconductor, or a group II-VI oxide semiconductor). For example, the group IV semiconductor may include silicon (Si), germanium (Ge), or silicon-germanium. The semiconductor substrate 201 may be provided as a bulk wafer or an epitaxial layer.

The peripheral circuit portion unit PERI may include conductive wiring 280 and a conductive via 270 for connecting transistors 220 of the peripheral circuit portion or connecting the memory cell portion CELL to the peripheral circuit portion PERI, and connection wiring insulating layer 292 insulating between the conductive wiring 280 and the conductive via 270 and forming a layer structure. In the present embodiment, for example, the conductive wiring 280 includes three wiring layers 282, 284, and 286, and the conductive via 270 includes three via layers 272, 274, and 276, but the number of the wiring layers or the number of the via layers may be 2 or less or 4 or more. The connection wiring insulating layer 292 may have a structure in which a plurality of insulating layers insulating the wiring layers 282, 284, and 286 are stacked, and may have a via hole filled with the via layers 272, 274, and 276. The conductive wiring 280 or the conductive via 270 may be formed of a metal such as tungsten or the like, and the connection wiring insulating layer 292 may be formed of a silicon oxide ($SiO_2$ or $Si(OC_2H_5)_4$) or the like.

A lower hydrogen diffusion barrier layer 295 may be disposed above or on the connection wiring insulating layer 292. The lower hydrogen diffusion barrier layer 295 may reduce penetration and diffusion of hydrogen into the peripheral circuit portion PERI disposed below in a subsequent process for forming the memory cell portion CELL. The hydrogen diffusion barrier layer 295 may be formed of a silicon nitride ($SiN_x$) or the like.

A lower insulation layer 294 may be disposed above or on the lower hydrogen diffusion barrier layer 295, and the lower insulation layer 294 may have a contact hole or a via hole for connecting a contact or a via of the memory cell portion CELL to conductive wiring 286 of the peripheral circuit portion PERI. The lower insulating layer 294 may be formed of a silicon oxide ($SiO_2$ or $Si(OC_2H_5)_4$) or the like.

A common source line barrier layer 101, a lower common source line semiconductor layer 102, a channel connection layer 103, an oxide-nitride-oxide (ONO) film structure formed by an oxide layer 111, a nitride layer 112, and an oxide layer 113, and an upper common source line semiconductor layer 104 may be stacked on the lower insulating layer 294. The common source line barrier layer 101 may include nitrided titanium, titanium nitride, tantalum, tantalum nitride, or the like, and the lower common source line semiconductor layer 102 or the upper common source line semiconductor layer 104 may be formed of polysilicon or the like. Oxide layers 111 and 113 may be formed of a silicon oxide ($SiO_2$), and the nitride layer 112 may be formed of a silicon nitride ($SiN_x$). The channel connection layer 103 may be a semiconductor layer substituted using the ONO film structure as a sacrificial layer, and may connect the lower common source line semiconductor layer 102 and the upper common source line semiconductor layer 104 to a vertical channel structure 140. The channel connection layer 103 may be formed of polysilicon. The common source line barrier layer 101, the lower common source line semiconductor layer 102, the channel connection layer 103, the ONO film structure formed by the oxide layer 111, the nitride layer 112, and the oxide layer 113, and the upper common source line semiconductor layer 104 may be patterned in a desired and/or alternatively predetermined shape to expose sidewalls (hereinafter referred to as exposed sidewalls of a common source line layer 100) thereof. The lower insulating layer 294 may be exposed between the exposed sidewalls of the common source line layer 100.

An upper hydrogen diffusion barrier layer 195 may cover the exposed sidewalls of the common source line layer 100 and the lower insulating layer 294 exposed tween the sidewalls. The upper hydrogen diffusion barrier layer 195 may reduce penetration and diffusion of hydrogen into the exposed sidewalls of the common source line layer 100 or the peripheral circuit portion PERI disposed below in the subsequent process for forming the memory cell portion CELL. The upper hydrogen diffusion barrier layer 195 may be formed of a silicon nitride ($SiN_x$) or the like.

An interlayer insulating layer 120 and a cell gate electrode 130 may be alternately and repeatedly stacked above the common source line layer 100, and a plurality of vertical channel structures 140 extending to the upper common source line semiconductor layer 104 and the lower common source line semiconductor layer 102 by passing through the interlayer insulating layer 120 and the cell gate electrode 130 may be disposed. Although not shown in FIG. 1, the vertical channel structures 140 may have a cylindrical structure in which a channel film, a tunnel insulating film, a charge storage film, and a blocking film are sequentially stacked around a buried insulating film. The channel film may include a semiconductor material such as polysilicon or the like. The tunnel insulating film may tunnel a charge into the charge storage film in an F—N manner. For example, the tunnel insulating film may include silicon oxide. The charge storage film may include a charge trap layer. The charge storage film may include a quantum dot or a nanocrystal. Here, the quantum dot or the nanocrystal may include a conductor (e.g., fine particles of a metal or a semiconductor). The blocking film may include a high-k dielectric material. Here, the high-k dielectric material may mean a dielectric material having a higher dielectric constant than that of a silicon oxide film. Since detailed materials of the tunnel insulating film, the charge storage film, and the blocking film are already known, a description thereof will be omitted. The tunnel insulating film, the charge storage film, and the blocking film function as a cell gate dielectric and are referred to as an oxide-nitride-oxide (ONO) film based on a characteristic of each layer. The cell gate electrode 130, the channel film, the tunnel insulating film, the charge storage film, and the blocking film may constitute a memory cell. A filling insulating layer 192 is disposed in a portion where the interlayer insulating layer 120 and the cell gate electrode 130 are not formed. The filling insulating layer 192 or the interlayer insulating layer 120 may be formed of a silicon oxide ($SiO_2$ or $Si(OC_2H_5)_4$) or the like. The cell gate electrode 130 may be formed of a metal such as tungsten or the like. The vertical channel structure 140 may be formed of a semiconductor such as polysilicon.

In the memory cell portion CELL, a common source line contact (or a plate channel contact) 164 may extend to the lower common source line semiconductor layer 102 filling a via hole of the lower insulating layer 294 by penetrating through the filling insulating layer 192, the upper common source line semiconductor layer 104, the ONO film structure, and the lower common source line semiconductor layer 102, and a through hole via 167 may be connected to the conductive wiring 286 of the peripheral circuit portion PERI by penetrating through the filling insulating layer 192, the upper hydrogen diffusion barrier layer 195, the lower insulating layer 294, and the lower hydrogen diffusion barrier layer 295. A through-cell metal contact 165 may be connected to the conductive wiring 286 of the peripheral circuit portion PERI by penetrating through a stacked structure of the interlayer insulating layer 120 and the cell gate electrode 130, the upper hydrogen diffusion barrier layer 195, the lower insulating layer 294, and the lower hydrogen diffusion barrier layer 295. The common source line contact 164, the through hole via 167, and the through-cell metal contact 165 may be formed of a metal such as tungsten or the like.

In addition, although not shown in FIG. 1, a bit line contact, a bit line, and the like formed above the filling insulating layer 192 may be disposed at the memory cell portion CELL.

As described above, if the lower hydrogen diffusion barrier layer 295 and the upper hydrogen diffusion barrier layer 195 are disposed, it is possible to limit and/or block penetration of hydrogen into the peripheral circuit portion PERI in a process of forming the memory cell portion CELL so that reliability of a device of the peripheral circuit portion PERI is improved.

FIGS. 2A to 2F are cross-sectional views illustrating a process of manufacturing the vertical nonvolatile memory device of FIG. 1.

Since a process of manufacturing the peripheral circuit portion PERI during the process of manufacturing the vertical nonvolatile memory device is not a main content of an embodiment, a detailed description thereof will be omitted.

Figure 2A:
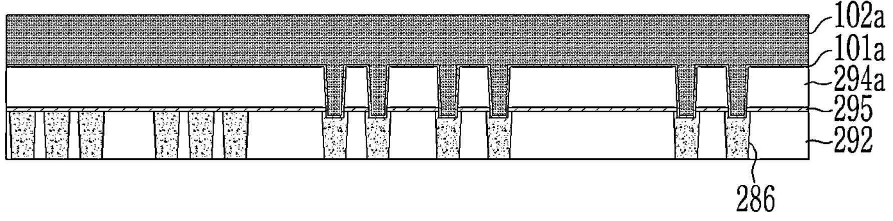
FIGS. 2A to 2F are cross-sectional views illustrating a process of manufacturing the vertical nonvolatile memory device of FIG. 1.

Referring to FIG. 2A, the peripheral circuit portion PERI may be formed on the semiconductor substrate 201, a nitride (e.g., a silicon nitride ($SiN_x$)) and an oxide (e.g., a silicon oxide ($SiO_2$)) covering the peripheral circuit portion PERI may be sequentially stacked, and the lower hydrogen diffusion barrier layer 295 and a preliminary lower insulating layer 294*a* having a via hole or a contact hole exposing a portion of the conductive wiring 286 may be formed by photo-etching. Subsequently, a metal containing layer such as nitrided titanium, titanium nitride, tantalum, tantalum nitride, or the like and a semiconductor layer such as polysilicon or the like may be successively stacked so that a preliminary common source line barrier layer 101*a* and a preliminary lower common source line semiconductor layer 102*a* are formed.

Figure 2B:
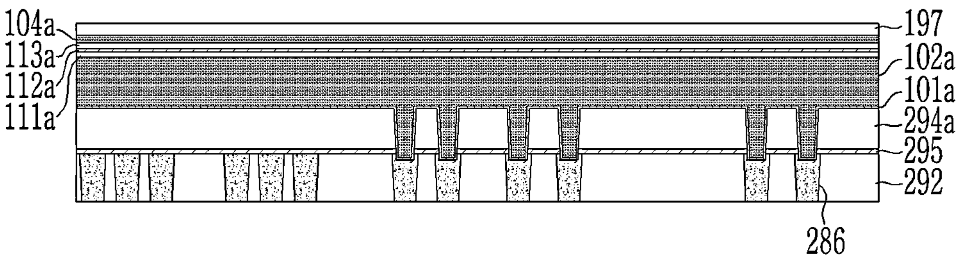

Referring to FIG. 2B, an oxide (e.g., a silicon oxide ($SiO_2$)), a nitride (e.g., a silicon nitride ($SiN_x$)), and an oxide (e.g., a silicon oxide ($SiO_2$)) may be sequentially stacked so that preliminary ONO layers 111*a*, 112*a*, and 113*a* are formed, and a semiconductor such as polysilicon or the like and a silicon oxide such as $SiO_2$, TEOS ($Si(OC_2H_5)_4$), or the like may be sequentially stacked on the preliminary ONO layers so that a preliminary upper common source line semiconductor layer 104*a* and a silicon oxide layer 197 are formed.

Figure 2C:
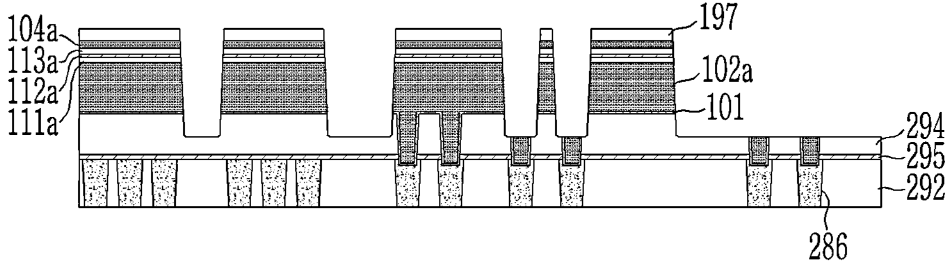

Referring to FIG. 2C, the silicon oxide layer 197, the preliminary upper common source line semiconductor layer 104*a*, the preliminary ONO layers 111*a*, 112*a*, and 113*a*, and the preliminary lower common source line semiconductor layer 102*a* may be photo-etched together to be patterned in a desired and/or alternatively predetermined shape so that sidewalls of the preliminary common source line layer 100 are exposed. In this case, the lower insulating layer 294 exposed between the exposed sidewalls of the preliminary common source line layer may also be partially etched.

Figure 2D:
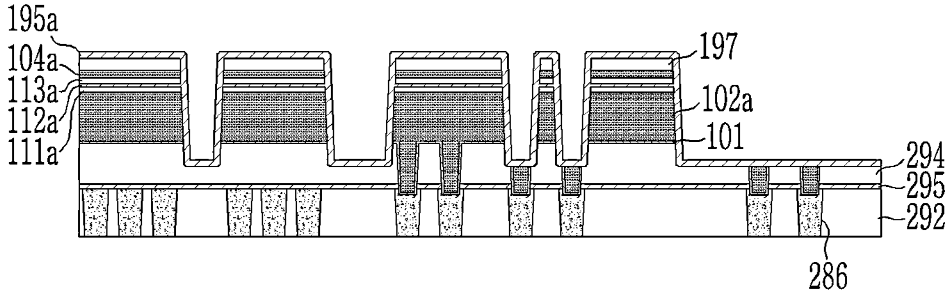

Referring to FIG. 2D, a material (e.g., a silicon nitride ($SiN_x$) or the like) having an excellent hydrogen blocking property may be deposited on the silicon oxide layer 197, the exposed sidewalls of the preliminary common source line layer, and the exposed lower insulating layer 294 so that a preliminary upper hydrogen diffusion barrier layer 195*a* is formed.

Figure 2E:
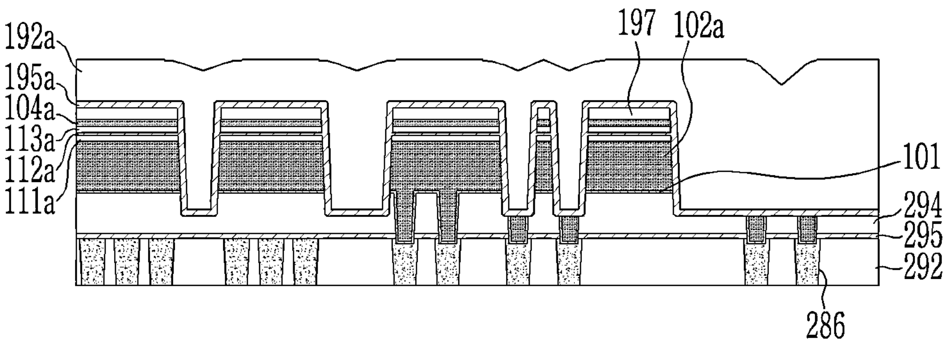

Referring to FIG. 2E, a silicon oxide such as $SiO_2$, TEOS ($Si(OC_2H_5)_4$), or the like may be stacked on the preliminary upper hydrogen diffusion barrier layer 195*a* to cover a lower structure so that a preliminary filling insulating layer 192*a* filling a space between the preliminary common source line layer is formed.

Figure 2F:
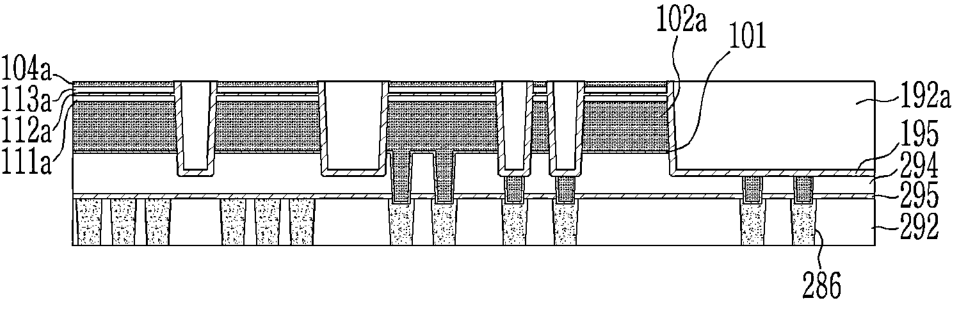

Referring to FIG. 2F, a planarization process may be performed on a structure of FIG. 2E using a method such as chemical mechanical polishing (CMP), etch-back, or the like. In this case, the preliminary filling insulating layer 192*a*, the preliminary upper hydrogen diffusion barrier layer 195*a*, and the silicon oxide layer 197 may be removed, and the preliminary upper common source line semiconductor layer 104*a* may also be partially removed. The preliminary upper common source line semiconductor layer 104*a* may be used as a CMP stop layer or an etch stop layer.

Thereafter, referring to FIG. 1, the interlayer insulating layer 120 and a sacrificial layer may be alternately and repeatedly stacked above the preliminary upper common source line semiconductor layer 104*a*. The sacrificial layer may be replaced with the cell gate electrode 130 through a subsequent process.

Thereafter, although not shown in FIG. 1, the interlayer insulating layer 120 and sacrificial layers may be etched in stages so that a mold structure having an edge portion having a step shape is formed, and a plurality of channel holes passing through the mold structure may be formed. The blocking film, the charge storage film, the tunnel insulating film, and the channel film may be sequentially formed at an inner wall of each of the channel holes and the buried insulating film completely filling the inside of each of the channel holes may be formed so that a preliminary vertical channel structure is formed.

Thereafter, although not shown in FIG. 1, the mold structure may be photo-etched so that a trench is formed at a region corresponding to a word line cut portion, and the oxide layers 111 and 113 and the nitride layer 112 positioned between the upper common source line semiconductor layer 104 and the lower common source line semiconductor layer 102 may be removed through the trench and then the removed oxide layers and nitride layer may be replaced with polysilicon so that the channel connection layer 103 is formed. In this case, the blocking film, the charge storage film, and the tunnel insulating film of the preliminary vertical channel structure exposed by removing the oxide layers 111 and 113 and the nitride layer 112 may be removed so that the channel film is in direct contact with the channel connection layer 103.

Thereafter, although not shown in FIG. 1, the sacrificial layers formed between the interlayer insulating layers 120 may be removed through the trench, and each of the removed sacrificial layers may be replaced with a metal layer so that the cell gate electrode 130 is formed.

Thereafter, referring to FIG. 1, various via holes may be formed through a photolithography process, and a conductive material such as a metal or the like may be formed so that the common source line contact, the through-cell metal contact, the through hole via, the bit line, the bit line contact, and the like are formed.

A subsequent process (e.g., a process that has little relevance to a main content of an embodiment) including a process of forming the peripheral circuit portion PERI and a process of forming the mold structure by alternately and repeatedly stacking the interlayer insulating layer 120 and the sacrificial layer above the preliminary upper common source line semiconductor layer 104*a* has been briefly described. The process may be substantially the same as an existing process of manufacturing a VNAND. For example, the existing process may be understood with reference to a process disclosed in Korean Patent Publication No. 2019-0054470.

Figure 3:
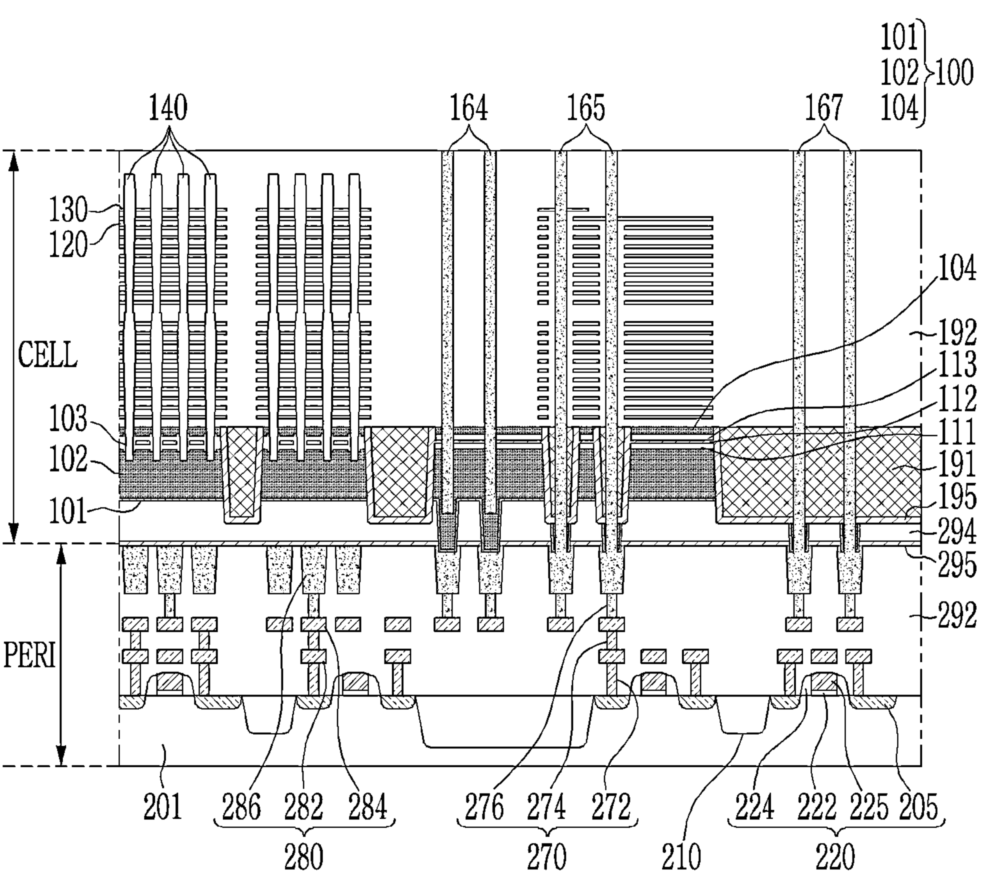
FIG. 3 is a cross-sectional view of the vertical nonvolatile memory device having the hydrogen diffusion barrier layer according to an embodiment.

FIG. 3 is a cross-sectional view of the vertical nonvolatile memory device having the hydrogen diffusion barrier layer according to an embodiment.

Hereinafter, different points will be mainly described based on the embodiment of FIG. 1.

The embodiment of FIG. 3 is different from the embodiment of FIG. 1 in that a hydrogen diffusion barrier filling layer 191 fills grooves formed by the upper hydrogen diffusion barrier layer 195. In other words, grooves may be formed between the exposed sidewalls of the common source line layer 100, the upper hydrogen diffusion barrier layer 195 may cover an inner surface of each of the grooves, and the hydrogen diffusion barrier filling layer 191 may fill a remaining space of each of the grooves. The hydrogen diffusion barrier filling layer 191 may be formed of a material (e.g., $Al_2O_3$, $Cr_2O_3$, $Er_2O_3$, $SiN_x$, or the like) having low hydrogen permeability. A material of the hydrogen diffusion barrier filling layer 191 may be the same as a material of upper hydrogen diffusion barrier layer 195.

As described above, when the hydrogen diffusion barrier filling layer 191 is disposed in addition to the lower hydrogen diffusion barrier layer 295 and the upper hydrogen diffusion barrier layer 195, it is possible to limit and/or block penetration of hydrogen into the peripheral circuit portion PERI more effectively in a process of forming the memory cell portion CELL so that reliability of a device of the peripheral circuit portion PERI is improved.

Figure 4A:
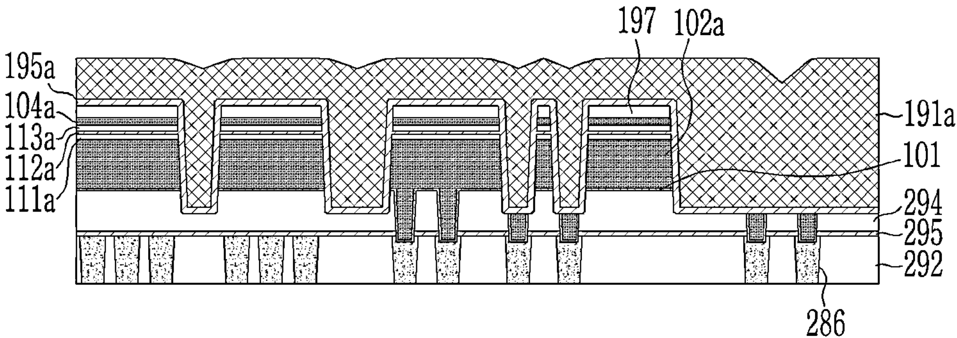
FIG. 4A and FIG. 4B are cross-sectional views illustrating a process of manufacturing the vertical nonvolatile memory device of FIG. 3.
Figure 4B:
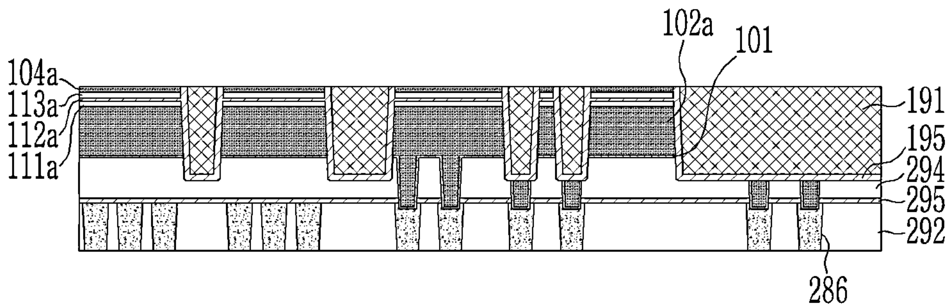

FIG. 4A and FIG. 4B are cross-sectional views illustrating a process of manufacturing the vertical nonvolatile memory device of FIG. 3.

The process of manufacturing the vertical nonvolatile memory device of FIG. 3 will also be described with reference to other parts compared with the process of manufacturing the vertical nonvolatile memory device of FIG. 1.

Processes up to the process in which the material (e.g., a silicon nitride ($SiN_x$) or the like) having the excellent hydrogen blocking property is stacked on the silicon oxide layer 197, the exposed sidewalls of the preliminary common source line layer, and the exposed lower insulating layer 294 so that the preliminary upper hydrogen diffusion barrier layer 195*a* is formed may be the same as the processes described with reference to FIGS. 2A to 2D.

Thereafter, referring to FIG. 4A, a material such as $Al_2O_3$, $Cr_2O_3$, $Er_2O_3$, $SiN_x$, or the like may be stacked on the preliminary upper hydrogen diffusion barrier layer 195*a* to cover a lower structure so that a preliminary hydrogen diffusion barrier filling layer 191*a* filling the space between the preliminary common source line layer is formed.

Next, referring to FIG. 4B, a planarization process may be performed on a structure of FIG. 4A using a method such as chemical mechanical polishing (CMP), etch-back, or the like. In this case, the preliminary hydrogen diffusion barrier filling layer 191_a_, the preliminary upper hydrogen diffusion barrier layer 195_a_, and the silicon oxide layer 197 may be removed, and the preliminary upper common source line semiconductor layer 104_a_ may also be partially removed. The preliminary upper common source line semiconductor layer 104_a_ may be used as a CMP stop layer or an etch stop layer.

A subsequent process including the process of forming the mold structure by alternately and repeatedly stacking the interlayer insulating layer 120 and the sacrificial layer above the preliminary upper common source line semiconductor layer 104_a_ may be the same as the process described in the embodiment of FIG. 1.

Figure 5:
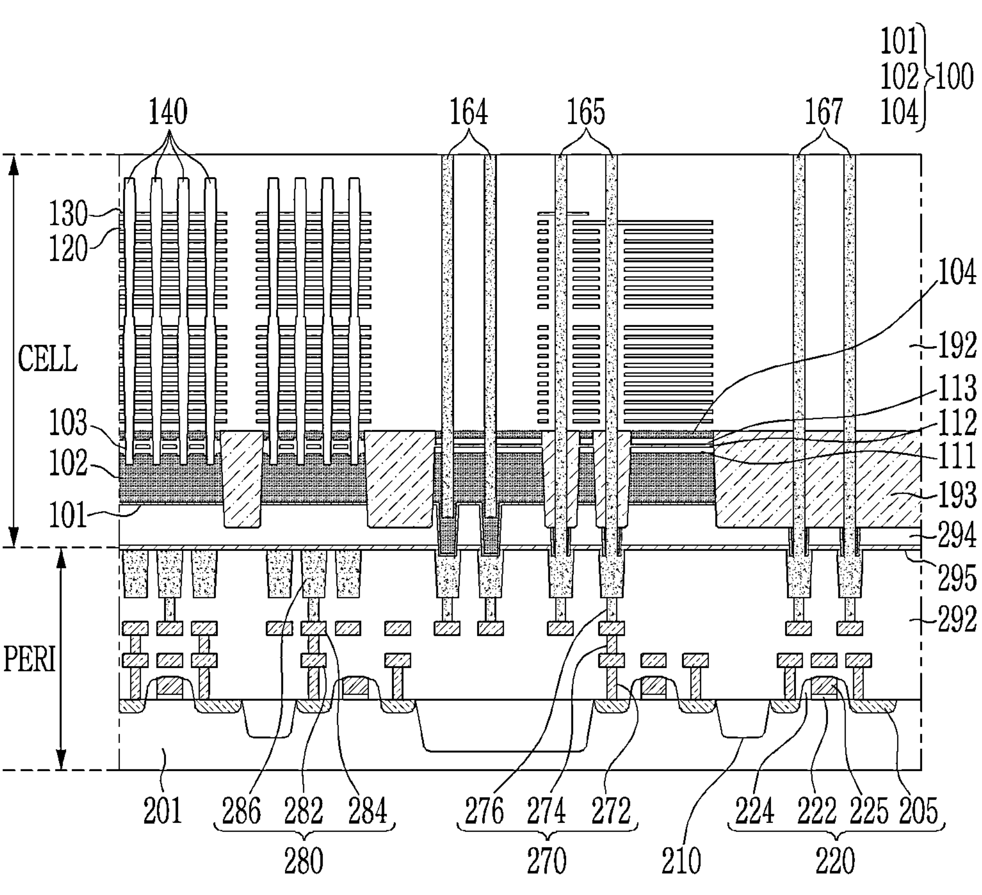
FIG. 5 is a cross-sectional view of the vertical nonvolatile memory device having the hydrogen diffusion barrier layer according to an embodiment.

FIG. 5 is a cross-sectional view of the vertical nonvolatile memory device having the hydrogen diffusion barrier layer according to an embodiment.

Hereinafter, different points will be mainly described based on the embodiment of FIG. 1.

The embodiment of FIG. 5 differs from the embodiment of FIG. 1 in that grooves are formed between the exposed sidewalls of the common source line layer 100 and a hydrogen diffusion barrier filling layer 193 fills the grooves. The hydrogen diffusion barrier filling layer 193 may be formed of a material (e.g., $Al_2O_3$, $Cr_2O_3$, $Er_2O_3$, $SiN_x$, or the like) having low hydrogen permeability. Compared with the embodiment of FIG. 3, the embodiment of FIG. 5 may have a structure in which the upper hydrogen diffusion barrier layer 195 is omitted. The hydrogen diffusion barrier filling layer 193 may be formed of the same material as that of the lower hydrogen diffusion barrier layer 295.

As described above, when the hydrogen diffusion barrier filling layer 193 is disposed in addition to the lower hydrogen diffusion barrier layer 295, it is possible to limit and/or block penetration of hydrogen into the peripheral circuit portion PERI more effectively in a process of forming the memory cell portion CELL so that reliability of a device of the peripheral circuit portion PERI is improved.

Figure 6A:
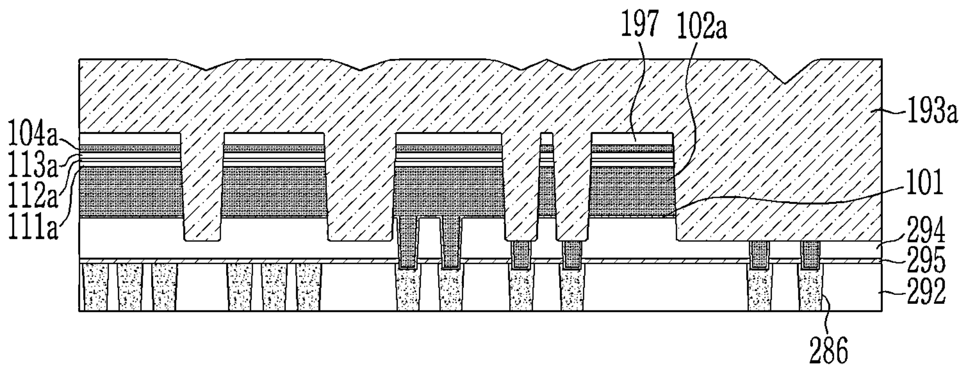
FIG. 6A and FIG. 6B are cross-sectional views illustrating a process of manufacturing the vertical nonvolatile memory device of FIG. 5.
Figure 6B:
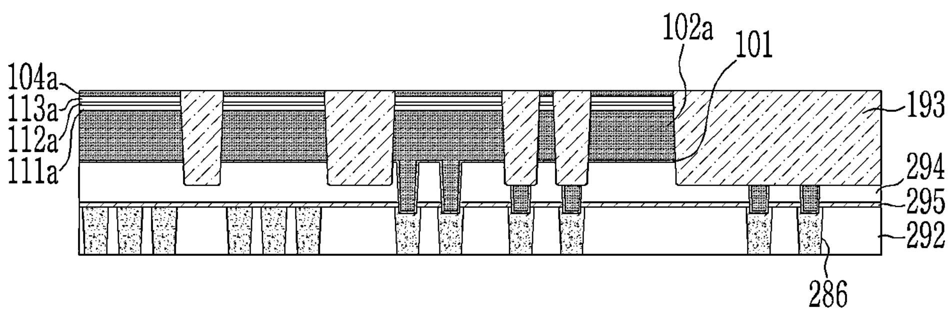

FIG. 6A and FIG. 6B are cross-sectional views illustrating a process of manufacturing the vertical nonvolatile memory device of FIG. 5.

The process of manufacturing the vertical nonvolatile memory device of FIG. 5 will also be described with reference to other parts compared with the process of manufacturing the vertical nonvolatile memory device of FIG. 1.

Processes up to the process in which the silicon oxide layer 197, the preliminary upper common source line semiconductor layer 104_a_, and the preliminary ONO layers 111_a_, 112_a_, and 113_a_ are photo-etched together to be patterned in a desired and/or alternatively predetermined shape so that the sidewalls of the preliminary common source line layer are exposed may be the same as the processes described with reference to FIGS. 2A to 2C.

Thereafter, referring to FIG. 6A, a material (e.g., $Al_2O_3$, $Cr_2O_3$, $Er_2O_3$, $SiN_x$, or the like) may be stacked on the silicon oxide layer 197, the exposed sidewalls of the preliminary common source line layer, and the lower insulating layer 294 exposed between the sidewalls to cover a lower structure so that a preliminary hydrogen diffusion barrier filling layer 193_a_ filling the space between the preliminary common source line layer is formed.

Next, referring to FIG. 6B, a planarization process may be performed on a structure of FIG. 6A using a method such as chemical mechanical polishing (CMP), etch-back, or the like. In this case, the preliminary hydrogen diffusion barrier filling layer 193_a_ and the silicon oxide layer 197 may be removed, and the preliminary upper common source line semiconductor layer 104_a_ may also be partially removed. The preliminary upper common source line semiconductor layer 104_a_ may be used as a CMP stop layer or an etch stop layer.

A subsequent process including the process of forming the mold structure by alternately and repeatedly stacking the interlayer insulating layer 120 and the sacrificial layer above the preliminary upper common source line semiconductor layer 104_a_ may be the same as the process described in the embodiment of FIG. 1.

Figure 7:
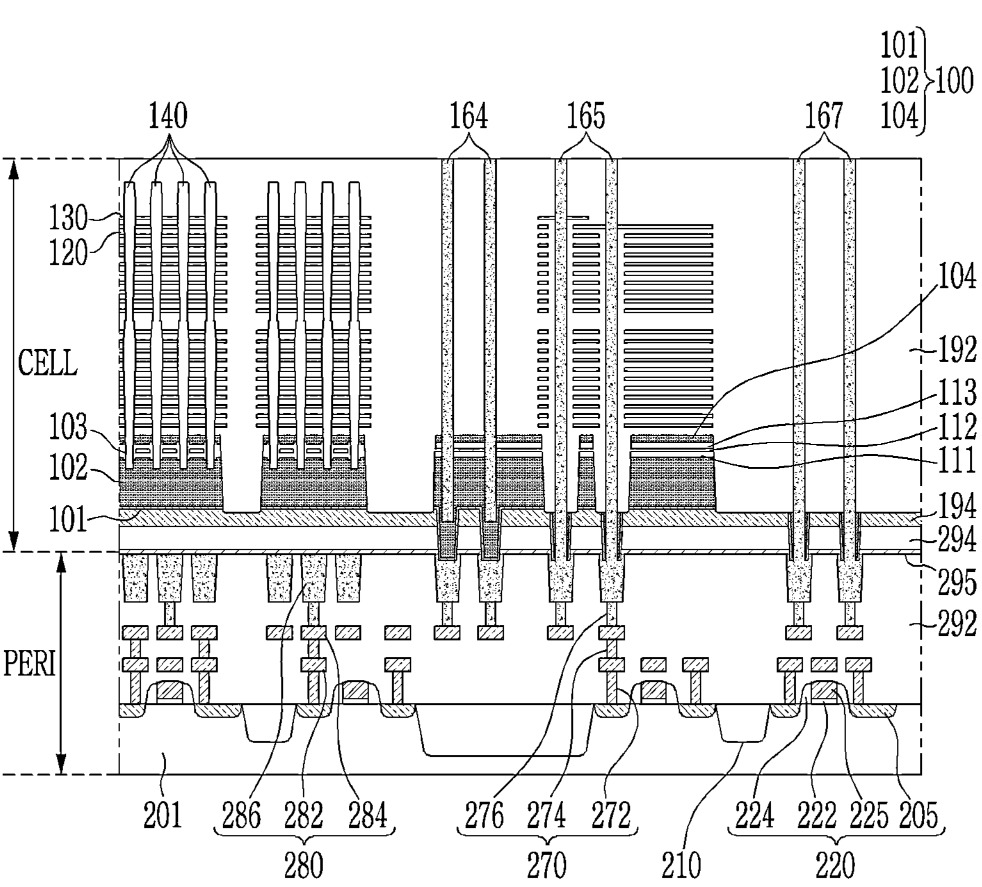
FIG. 7 is a cross-sectional view of the vertical nonvolatile memory device having the hydrogen diffusion barrier layer according to an embodiment.

FIG. 7 is a cross-sectional view of the vertical nonvolatile memory device having the hydrogen diffusion barrier layer according to an embodiment.

Hereinafter, different points will be mainly described based on the embodiment of FIG. 1.

The embodiment of FIG. 7 differs from the embodiment of FIG. 1 in that an upper hydrogen diffusion barrier layer 194 is disposed under the common source line barrier layer 101. That is, the upper hydrogen diffusion barrier layer 194 may be disposed between the lower insulating layer 294 and the common source line barrier layer 101.

As described above, if the lower hydrogen diffusion barrier layer 295 and the upper hydrogen diffusion barrier layer 195 are disposed, it is possible to limit and/or block penetration of hydrogen into the peripheral circuit portion PERI in a process of forming the memory cell portion CELL so that reliability of a device of the peripheral circuit portion PERI is improved.

FIG. 8A through FIG. 8E are cross-sectional views illustrating a process of manufacturing the vertical nonvolatile memory device of FIG. 7.

Since a process of manufacturing the peripheral circuit portion PERI during the process of manufacturing the vertical nonvolatile memory device is not a main content of an embodiment, a detailed description thereof will be omitted.

Figure 8A:
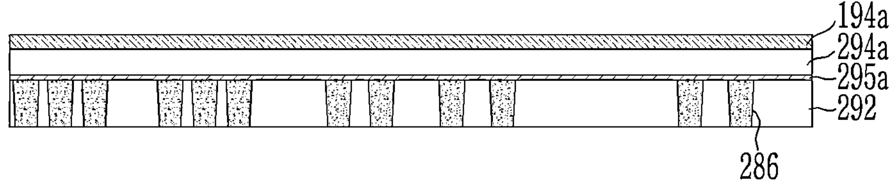
FIG. 8A to FIG. 8E are cross-sectional views illustrating a process of manufacturing the vertical nonvolatile memory device of FIG. 7.

Referring to FIG. 8A, the peripheral circuit portion PERI may be formed on the semiconductor substrate 201, a nitride (e.g., a silicon nitride ($SiN_x$)), an oxide (e.g., a silicon oxide ($SiO_2$)), and a nitride (e.g., a silicon nitride ($SiN_x$)) covering the peripheral circuit portion PERI may be sequentially stacked so that a preliminary lower hydrogen diffusion barrier layer 295_a_, the preliminary lower insulating layer 294_a_, and a preliminary upper hydrogen diffusion barrier layer 194_a_ are formed.

Figure 8B:
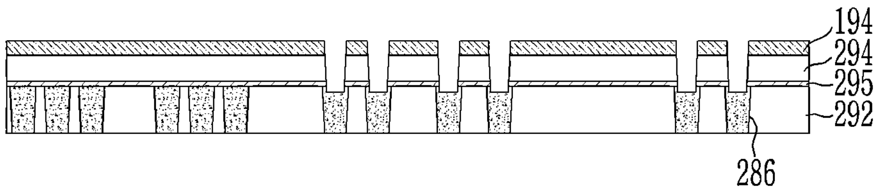

Referring to FIG. 8B, a via hole or a contact hole exposing a portion of the conductive wiring 286 may be formed by photo-etching the preliminary lower hydrogen diffusion barrier layer 295_a_, the preliminary lower insulating layer 294_a_, and the preliminary upper hydrogen diffusion barrier layer 194_a_ so that the lower hydrogen diffusion barrier layer 295, the lower insulating layer 294, and the upper hydrogen diffusion barrier layer 194 are formed.

Figure 8C:
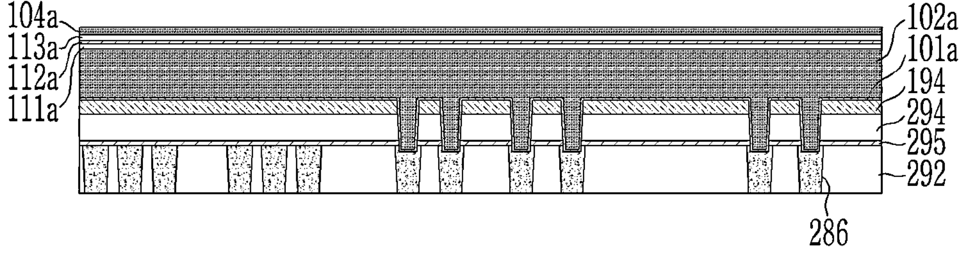

Referring to FIG. 8C, a metal containing layer such as nitrided titanium, titanium nitride, tantalum, tantalum nitride, or the like and a semiconductor layer such as polysilicon or the like may be successively stacked on the upper hydrogen diffusion barrier layer 194 so that the preliminary common source line barrier layer 101_a_ and the preliminary lower common source line semiconductor layer 102_a_ are formed. Subsequently, the preliminary ONO layers 111_a_, 112_a_, and 113_a_ and the preliminary upper common source line semiconductor layer 104_a_ may be sequentially formed.

Figure 8D:
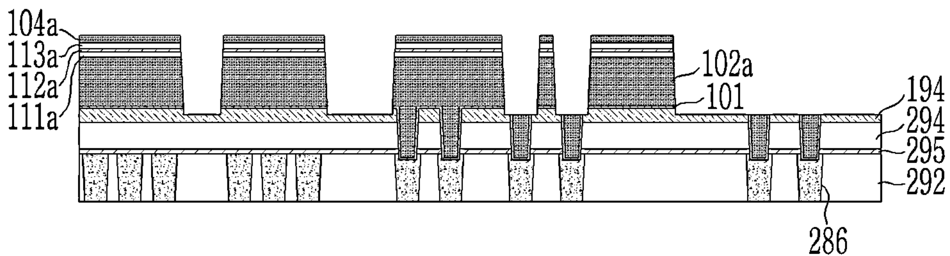

Referring to FIG. 8D, the preliminary upper common source line semiconductor layer 104_a_, the preliminary ONO layers 111_a_, 112_a_, and 113_a_, and the preliminary lower common source line semiconductor layer 102*a* may be photo-etched together to be patterned in a desired and/or alternatively predetermined shape so that the sidewalls of the preliminary common source line layer are exposed. In this case, the upper hydrogen diffusion barrier layer 194 exposed between the exposed sidewalls of the preliminary common source line layer may also be partially etched.

Figure 8E:
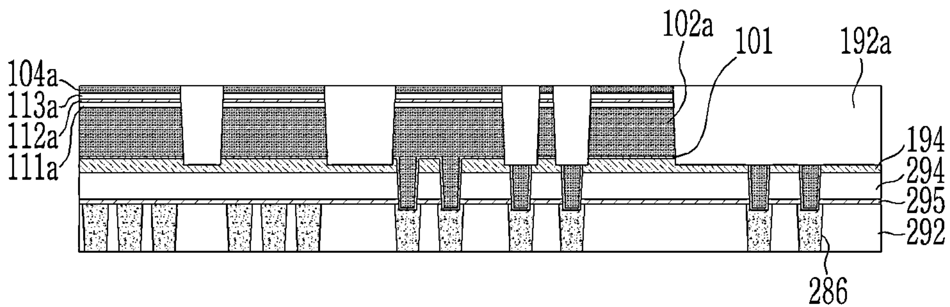

Referring to FIG. 8E, a silicon oxide such as $SiO_2$, TEOS ($Si(OC_2H_5)_4$), or the like may be stacked above or on a structure patterned in a desired and/or alternatively predetermined shape in FIG. 8D to cover a lower structure so that a silicon oxide layer filling a space between the preliminary common source line layer is formed, and a planarization process may be performed on the silicon oxide layer using a method such as chemical mechanical polishing (CMP), etch-back, or the like. In this case, the preliminary upper common source line semiconductor layer 104*a* may also be partially removed. The preliminary upper common source line semiconductor layer 104*a* may be used as a CMP stop layer or an etch stop layer.

A subsequent process including the process of forming the mold structure by alternately and repeatedly stacking the interlayer insulating layer 120 and the sacrificial layer above the preliminary upper common source line semiconductor layer 104*a* may be the same as the process described in the embodiment of FIG. 1.

Figure 9:
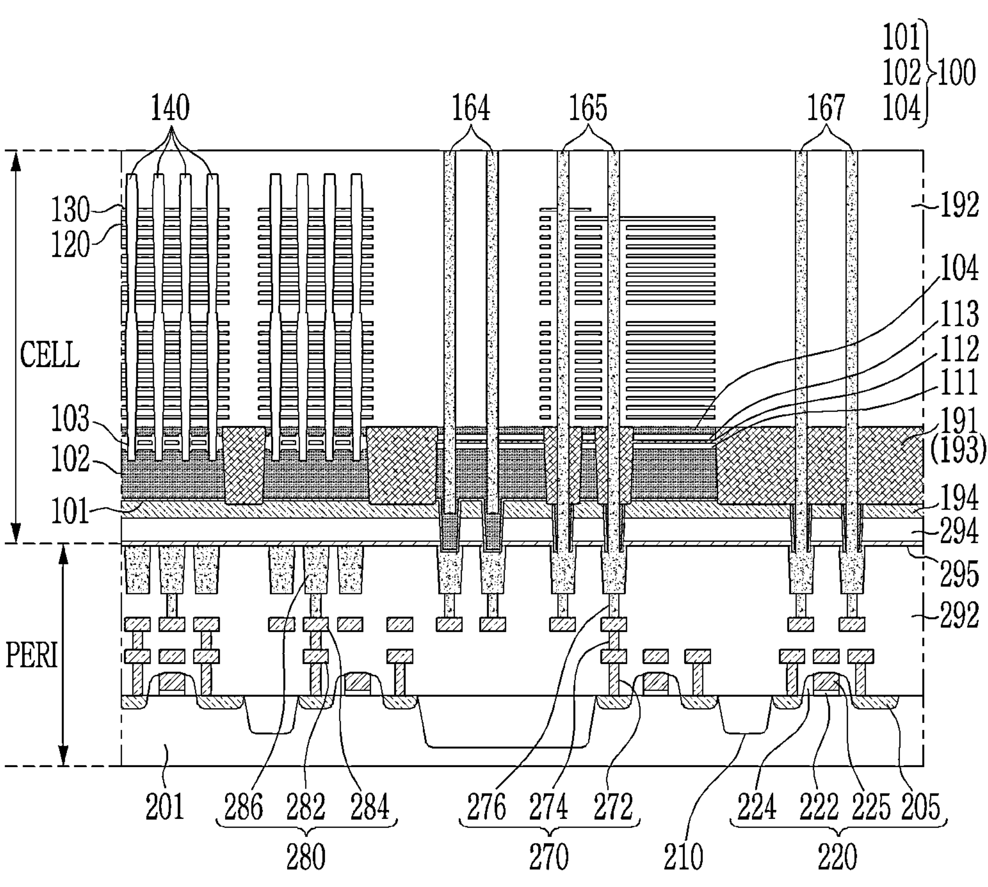
FIG. 9 is a cross-sectional view of the vertical nonvolatile memory device having the hydrogen diffusion barrier layer according to an embodiment.

FIG. 9 is a cross-sectional view of the vertical nonvolatile memory device having the hydrogen diffusion barrier layer according to an embodiment.

Hereinafter, different points will be mainly described based on the embodiment of FIG. 7.

The embodiment of FIG. 9 differs from the embodiment of FIG. 7 in that grooves are formed between the exposed sidewalls of the common source line layer 100 and the hydrogen diffusion barrier filling layer 191 fills the grooves. The hydrogen diffusion barrier filling layer 191 may be formed of a material (e.g., $Al_2O_3$, $Cr_2O_3$, $Er_2O_3$, $SiN_x$, or the like) having low hydrogen permeability. The hydrogen diffusion barrier filling layer 191 may be formed of the same material (e.g., a silicon nitride ($SiN_x$)) as that of the upper hydrogen diffusion barrier layer 194.

As described above, when the hydrogen diffusion barrier filling layer 191 is disposed in addition to the lower hydrogen diffusion barrier layer 295 and the upper hydrogen diffusion barrier layer 194, it is possible to limit and/or block penetration of hydrogen into the common source line layer 100 and the peripheral circuit portion PERI that are disposed below more effectively in a process of forming the memory cell portion CELL so that reliability of the common source line layer and a device of the peripheral circuit portion PERI is improved.

Figure 10:
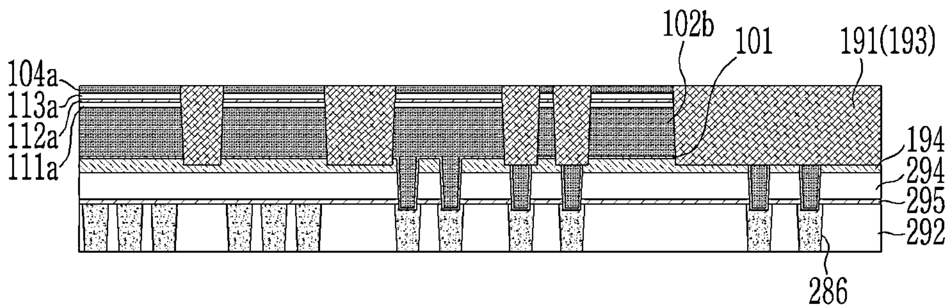
FIG. 10 is a cross-sectional view illustrating a process of manufacturing the vertical nonvolatile memory device of FIG. 9.

FIG. 10 is a cross-sectional view illustrating a process of manufacturing the vertical nonvolatile memory device of FIG. 9.

The process of manufacturing the vertical nonvolatile memory device of FIG. 9 will also be described with reference to other parts compared with the process of manufacturing the vertical nonvolatile memory device of FIG. 7.

Processes up to the process in which the preliminary upper common source line semiconductor layer 104*a*, the preliminary ONO layers 111*a*, 112*a*, and 113*a*, and the preliminary lower common source line semiconductor layer 102*a* are photo-etched together to be patterned in a desired and/or alternatively predetermined shape so that the sidewalls of the preliminary common source line layer are exposed may be the same as the processes described with reference to FIGS. 8A to 8D.

Thereafter, a material (e.g., $Al_2O_3$, $Cr_2O_3$, $Er_2O_3$, $SiN_x$, or the like) may be stacked above or on a structure patterned in a desired and/or alternatively predetermined shape in FIG. 8D to cover a lower structure so that the preliminary hydrogen diffusion barrier filling layer filling the space between the preliminary common source line layer is formed. Thereafter, referring to FIG. 10, a planarization process may be performed on the preliminary hydrogen diffusion barrier filling layer using a method such as chemical mechanical polishing (CMP), etch-back, or the like so that the hydrogen diffusion barrier filling layer 191 is formed. In this case, the preliminary upper common source line semiconductor layer 104*a* may also be partially removed. The preliminary upper common source line semiconductor layer 104*a* may be used as a CMP stop layer or an etch stop layer.

A subsequent process including the process of forming the mold structure by alternately and repeatedly stacking the interlayer insulating layer 120 and the sacrificial layer above the preliminary upper common source line semiconductor layer 104*a* may be the same as the process described in the embodiment of FIG. 1.

One or more of the elements disclosed above may be included or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some embodiments of inventive concepts have been described, it is to be understood that inventive concepts are not limited to the disclosed embodiments. On the contrary, inventive concepts are intended to cover various modifications and equivalent arrangements included within the spirit and scope of the appended claims.

What is claimed is:

1. A vertical nonvolatile memory device comprising:

a peripheral circuit portion including a memory cell driving circuit and connection wiring;

a first hydrogen diffusion barrier layer above the peripheral circuit portion;

a first insulating layer above the first hydrogen diffusion barrier layer;

a common source line layer above the first insulating layer;

a second hydrogen diffusion barrier layer above the first insulating layer; and a memory cell stack structure above the common source line layer and the second hydrogen diffusion barrier layer, wherein the memory cell stack structure includes a plurality of gate electrodes and a plurality of interlayer insulating layers, which are alternately stacked on top of each other, wherein a lowermost one of the plurality of gate electrodes is on top of a lowermost one of the plurality of interlayer insulating layers.

2. The vertical nonvolatile memory device of claim 1, wherein the second hydrogen diffusion barrier layer covers sidewalls of the common source line layer and an exposed portion of the first insulating layer, and the exposed portion of the first insulating layer is not covered by the common source line layer such that the exposed portion of the first insulating layer is exposed by the common source line layer.

3. The vertical nonvolatile memory device of claim 2, further comprising:

a hydrogen diffusion barrier filling layer on the second hydrogen diffusion barrier layer, wherein the hydrogen diffusion barrier filling layer fills a space between the sidewalls of the common source line layer.

4. The vertical nonvolatile memory device of claim 3, wherein a material of the second hydrogen diffusion barrier layer is the same as a material of the hydrogen diffusion barrier filling layer.

5. The vertical nonvolatile memory device of claim 4, wherein the second hydrogen diffusion barrier layer and the hydrogen diffusion barrier filling layer each include silicon nitride.

6. The vertical nonvolatile memory device of claim 3, wherein the hydrogen diffusion barrier filling layer includes at least one of $Al_2O_3$, $Cr_2O_3$, $Er_2O_3$, and $SiN_x$, and the second hydrogen diffusion barrier layer includes silicon nitride.

7. The vertical nonvolatile memory device of claim 1, wherein the second hydrogen diffusion barrier layer is between the first insulating layer and the common source line layer.

8. The vertical nonvolatile memory device of claim 7, further comprising:

a hydrogen diffusion barrier filling layer filling a space between sidewalls of the common source line layer.

9. The vertical nonvolatile memory device of claim 8, wherein a material of the second hydrogen diffusion barrier layer is the same as a material of the hydrogen diffusion barrier filling layer.

10. The vertical nonvolatile memory device of claim 9, wherein the second hydrogen diffusion barrier layer and the hydrogen diffusion barrier filling layer include silicon nitride.

11. The vertical nonvolatile memory device of claim 8, wherein the hydrogen diffusion barrier filling layer includes at least one of $Al_2O_3$, $Cr_2O_3$, $Er_2O_3$, and $SiN_x$, and the second hydrogen diffusion barrier layer includes silicon nitride.

12. The vertical nonvolatile memory device of claim 1, wherein the first hydrogen diffusion barrier layer and the second hydrogen diffusion barrier layer independently include at least one of $Al_2O_3$, $Cr_2O_3$, $Er_2O_3$, and $SiN_x$.

13. A manufacturing method of a vertical nonvolatile memory device, comprising:

forming a first hydrogen diffusion barrier layer and a first insulating layer above a peripheral circuit portion, the peripheral circuit portion including a memory cell driving circuit and a connection wiring;

forming a preliminary common source line layer above the first insulating layer;

patterning the preliminary common source line layer to form a patterned preliminary common source line layer, the patterned preliminary common source line layer exposing sidewalls of the patterned preliminary common source line layer and the first insulating layer between the sidewalls of the patterned preliminary common source line layer;

forming a preliminary second hydrogen diffusion barrier layer above the patterned preliminary common source line layer;

forming a preliminary filling insulating layer filling a space between the sidewalls of the patterned preliminary common source line layer and above the preliminary second hydrogen diffusion barrier layer;

performing a planarization process on a structure including the preliminary filling insulating layer and the preliminary second hydrogen diffusion barrier layer to provide a planarized structure including planarized portions of the preliminary filling insulating layer and the preliminary second hydrogen diffusion barrier layer; and forming a memory cell stack structure above the planarized structure.

14. The manufacturing method of claim 13, wherein the preliminary filling insulating layer includes silicon oxide, and the preliminary second hydrogen diffusion barrier layer includes silicon nitride.

15. The manufacturing method of claim 13, wherein the preliminary filling insulating layer includes at least one of $Al_2O_3$, $Cr_2O_3$, $Er_2O_3$, and $SiN_x$, and the preliminary second hydrogen diffusion barrier layer includes silicon nitride.

16. The manufacturing method of claim 13, wherein the preliminary second hydrogen diffusion barrier layer is formed of a same material as the preliminary filling insulating layer, and the forming the preliminary second hydrogen diffusion barrier layer and the forming the preliminary filling insulating layer are performed at a same time.

17. The manufacturing method of claim 16, wherein the preliminary second hydrogen diffusion barrier layer includes silicon nitride and the preliminary filling insulating layer includes silicon nitride.

18. A manufacturing method of a vertical nonvolatile memory device, comprising:

sequentially forming a preliminary first hydrogen diffusion barrier layer, a preliminary first insulating layer, and a preliminary second hydrogen diffusion barrier layer above a peripheral circuit portion including a memory cell driving circuit and a connection wiring;

forming a first hydrogen diffusion barrier layer, a first insulating layer, and a second hydrogen diffusion barrier layer having a via hole or a contact hole by photo-etching the preliminary first hydrogen diffusion barrier layer, the preliminary first insulating layer, and the preliminary second hydrogen diffusion barrier layer;

forming a preliminary common source line layer above the second hydrogen diffusion barrier layer;

forming a patterned preliminary common source line layer by patterning the preliminary common source line layer to expose sidewalls of the preliminary common source line layer and the second hydrogen diffusion barrier layer between the sidewalls;

forming a preliminary filling insulating layer above the patterned preliminary common source line layer, the preliminary filling insulating layer filling a space between sidewalls of the patterned preliminary common source line layer; and performing a planarization process on the preliminary filling insulating layer.

19. The manufacturing method of claim 18, wherein the preliminary filling insulating layer includes silicon oxide, and the second hydrogen diffusion barrier layer includes silicon nitride.

20. The manufacturing method of claim 18, wherein the preliminary filling insulating layer includes at least one of $Al_2O_3$, $Cr_2O_3$, $Er_2O_3$, and $SiN_x$, and the second hydrogen diffusion barrier layer includes silicon nitride.

* * * * *